(12) United States Patent
Yen et al.

(10) Patent No.: US 10,215,328 B2
(45) Date of Patent: Feb. 26, 2019

(54) SUPPORTING DEVICE

(71) Applicant: SYNCMOLD ENTERPRISE CORP., New Taipei (TW)

(72) Inventors: Ching-Hui Yen, New Taipei (TW); Chien-Cheng Yeh, New Taipei (TW)

(73) Assignee: SYNCMOLD ENTERPRISE CORP., New Taipei (TW)

( * ) Notice: Subject to any disclaimer, the term of this patent is extended or adjusted under 35 U.S.C. 154(b) by 0 days.

(21) Appl. No.: 15/966,419

(22) Filed: Apr. 30, 2018

(65) Prior Publication Data

US 2018/0363836 A1    Dec. 20, 2018

Related U.S. Application Data

(60) Provisional application No. 62/520,865, filed on Jun. 16, 2017.

(30) Foreign Application Priority Data

Jan. 19, 2018  (TW) .............................. 107200945 U

(51) Int. Cl.
*H05K 5/00* (2006.01)
*F16M 11/04* (2006.01)
*H05K 5/02* (2006.01)

(52) U.S. Cl.
CPC ..... *F16M 11/043* (2013.01); *F16M 2200/025* (2013.01); *H05K 5/0213* (2013.01); *H05K 5/0286* (2013.01)

(58) Field of Classification Search
CPC ... F16M 11/043; H05K 5/0213; H05K 5/0286

USPC .......................... 248/176.3, 917; 361/679.01
See application file for complete search history.

(56) References Cited

U.S. PATENT DOCUMENTS

| | | | |
|---|---|---|---|
| 2008/0210843 A1* | 9/2008 | Han | H05K 5/0213 361/679.01 |
| 2010/0246105 A1* | 9/2010 | Li | G06F 1/184 361/679.01 |
| 2012/0026652 A1* | 2/2012 | Liang | H04M 1/0237 361/679.01 |
| 2014/0002971 A1* | 1/2014 | Chung | H05K 5/0286 361/679.01 |

* cited by examiner

*Primary Examiner* — Todd M Epps
(74) *Attorney, Agent, or Firm* — Muncy, Geissler, Olds & Lowe, P.C.

(57) ABSTRACT

A supporting device for holding a display module is disclosed. The supporting device comprises a main board, a first spacer layer, a first board and a sliding board. The main board extends along a first axis, and the first spacer layer overlaps on the main board. The first board is disposed on the first spacer layer so that a first sliding groove is formed by the main board, the first spacer layer and the first board. The sliding board is partially received in the first sliding groove so as to contact with at least one of the main board, the first spacer layer and the first board. When an external force is applied to the sliding panel, a first sliding block is rubbed against at least one of the main board, the first spacer layer and the first board so that the sliding panel is able to move along the first axis with respect to the main board between a highest position and a lowest position.

9 Claims, 5 Drawing Sheets

SUPPORTING DEVICE

CROSS REFERENCE TO RELATED APPLICATION

This application claims the benefit of U.S. Provisional Application Ser. No. 62/520,865 filed on Jun. 16, 2017, and the benefit of Taiwan Patent Application Serial No. 107200945 filed on Jan. 19, 2018. The entirety of each said Application is incorporated herein by reference.

BACKGROUND OF THE INVENTION

1. Field of the Invention

The present invention relates to a supporting device, more particularly, to a supporting device for supporting and elevating a display module.

2. Description of Related Art

A conventional supporting device usually comprises a slider, a slide module, a frame, and an elastic element. The slide module has an outer rail, an inner rail and a ball set. The ball set is disposed between the outer rail and the inner rail so that the inner rail is able to move with respect to the outer rail through the ball set. The outer rail is fixed to the frame, and the slider is disposed on the inner rail and is able to be combined with a display device through other elements. The elastic element is connected to the slider and the frame so that the slider is adapted to move up and down and stop at any position with respect to the frame. Since the outer rail and the inner rail are formed by bending boards, the conventional supporting device is bulky and thick in view of the configuration of the outer rail and the inner rail and the thickness of the boards.

Accordingly, the present invention provides a slim supporting device.

SUMMARY OF THE INVENTION

The object of the present invention is to provide a supporting device comprising a plurality of layers or boards overlapping together to form a sliding groove. A sliding panel is assembled in the sliding groove directly so that the conventional slide module is no more necessary. Therefore, the supporting device is adapted to hold the display device, and the display device is adapted to stop at any position.

Another object of the present invention is to provide a supporting device having the sliding groove being formed by overlapping the layers or boards to each other. The whole thickness of the supporting device is decided by controlling thickness of each of the layers or boards. Since there is no need to bend any board, the size of the supporting device can be controlled and the manufacturing processes can be simplified.

To achieve the abovementioned object, the supporting device is utilized for holding a display module. The supporting device comprises a main board having a surface, a first spacer layer overlapping on the surface of the main board, and a first board is mounted on the first spacer layer, wherein the first board, the main board and the first spacer layer integrally form a first sliding groove extending along a first axis. A sliding panel is partially received in the first sliding groove and contacts with at least one of the main board, the first spacer layer and the first board, and holds the display module. An elastic member connects to the main board and the sliding panel respectively. The sliding panel partially rubs against at least one of the main board, the first spacer layer and the first board when an external force is applied to the sliding panel so that the sliding panel is able to move along the first axis between a highest position and a lowest position with respect to the main board. The elastic member continuously provides an elastic force so that the sliding panel and the display module is able to stop at any position with respect to the main board when the external force is removed.

In view of a second axis, a width of the main bard and a width of the first board are both greater than a width of the first spacer layer, in view of a second axis, so that the main board, the first spacer layer and the first board are overlapped to form the first sliding groove.

The sliding panel has a flat plate and a first sliding block disposed on an end of the flat plate. The first spacer layer has a convex arc surface contacting with the first sliding block.

In one embodiment, the first spacer layer and the main board are integrally formed.

In another embodiment, the first spacer layer and the first board are integrally formed with each other.

The first spacer layer has a plurality of rollers and a plurality of rolling shafts. The rollers are sequentially arranged on the surface of the main board. Each of the rolling shafts is disposed at a central of each of the rollers, and an axis defined by the rolling shafts is parallel to a third axis. When the sliding panel moves along the first axis with respect to the main board, the first sliding block contacts with an arc surface of each of the rollers so that the rollers rotate about the rolling shafts.

The supporting device further comprises a second spacer layer and a second board, wherein the second spacer layer is disposed on the surface of the main board, and the second board is mounted on the second spacer layer so that the main board, the second spacer layer and the second board collaboratively form a second sliding groove. The sliding board has a second sliding block connecting to the other end of the flat plate. The second sliding block is received in the second sliding groove, and contacting with at least one of the main board, the second spacer layer and the second board, so that the second sliding block is able to rub against at least one of the main board, the first spacer layer and the first board when the external force is applied to the sliding panel.

In view of a second axis, a width of the main board and a width of the second board are both greater than a width of the second spacer layer so that the main board, the second spacer layer and the second board are fixed to collaboratively form the second sliding groove. The first sliding block, the main board, the first spacer layer and the first board contact with each other, whereas the second sliding block, the main board, the second spacer layer and the second board contact with each other The detailed technology and preferred embodiments implemented for the subject invention are described in the following paragraphs accompanying the appended drawings for people skilled in this field to well appreciate the features of the claimed invention.

DETAILED DESCRIPTION OF THE PREFERRED EMBODIMENT

Figure 1:
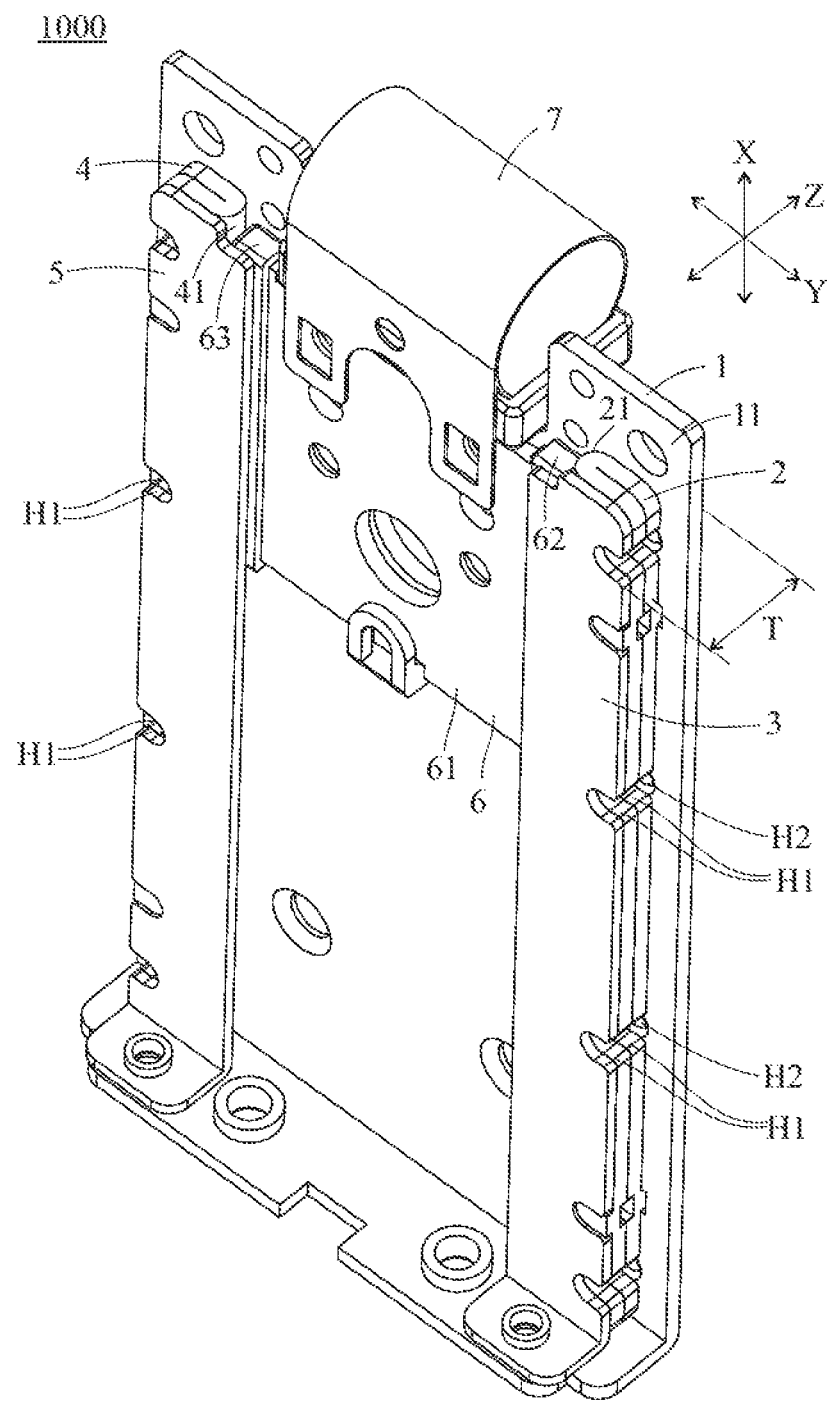
FIG. 1 is a perspective view of the supporting device of the first embodiment of the present invention.
Figure 2:
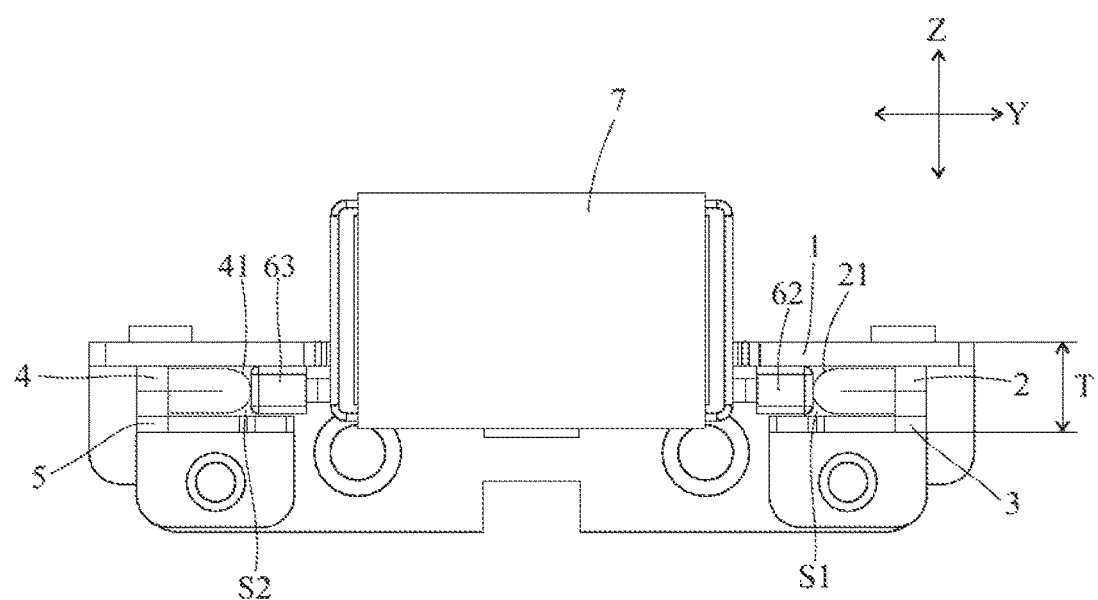
FIG. 2 is a top plane view of the supporting device of the first embodiment of the present invention.

Please refer to FIG. 1 and FIG. 2, a supporting device 1000 for holding a display module comprises a main board 1, a first spacer layer 2, a first board 3, a second spacer layer 4, a second board 5, a sliding panel 6 and an elastic member 7. The detailed structure of each element and the relationship between the elements are further described herein below.

The main board 1 has a surface 11. The first spacer layer 2 and the second spacer layer 4 overlap on the surface 11 of the main board 1 and are spaced apart from each other. The first board 3 is mounted on the first spacer layer 2. The second board 5 is mounted on the second spacer layer 4. Therefore, the first board 3, the first spacer layer 2 and the main board 1 collaboratively form a first sliding groove S1, and the second board 5, the second spacer layer 4 and the main board 1 collaboratively form a second sliding groove S2. The first sliding groove S1 and the second sliding groove S2 extend along a first axis X and are corresponding to each other. In more detail, in view of a second axis Y (that is, being perpendicular to the first axis X), a width of the main board 1 and a width of the first board 3 are both greater than a width of the first spacer layer 2 so that the first sliding groove S1 is formed when the first spacer layer 2 is disposed between the main board 1 and the first board 3. Similarly, in view of the second axis Y, the width of the main board 1 and the second board 5 are greater than a width of the second spacer layer 4 so that the second sliding groove S2 is formed when the second spacer layer 4 is disposed between the main board 1 and the second board 5.

In the present embodiment, all of the first spacer layer 2, the first board 3, the second spacer layer 4 and the second board 5 have a plurality of recesses H1. The main board 1 has a plurality of holes H2 corresponding to the recesses H1. A plurality of securing elements (not shown in the figures) are adapted to pass through the recesses H1 and the holes H2 to fasten the main board 1, the first spacer layer 2, the first board 3, the second spacer layer 4 and the second board 5 together. However, in other embodiments, the above mentioned elements are able to be bonded together by other manners (such as using adhesive).

The sliding panel 6 is located between the first spacer layer 2 and the second spacer layer 4 and is partially received in the first sliding groove S1 and the second sliding groove S2. The sliding panel 6 is able to slide along the first axis X back and forth. Furthermore, the sliding panel 6 has a flat plate 61, a first sliding block 62 and a second sliding block 63. The first sliding block 62 and the third sliding block 63 are disposed at and receiving two ends of the flat plate 61 respectively due to the thinning requirement of the present invention. The first sliding block 62 is received in the first sliding groove S1, and the second sliding block 63 is received in the second sliding groove S2. The first sliding block 62 contacts with a convex arc surface 21 of the first spacer layer 2, and the second sliding block 63 contacts with a convex arc surface 41 of the second spacer layer 4. The convex arc surfaces 21, 41 are adapted to reduce the contacting area with the first sliding block 62 and the second sliding block 63. Therefore, a friction is able to be reduced when the sliding panel 6 slides. In addition, the first spacer layer 2 and the second spacer layer 4 are formed by bending and then pressing so as to form the convex arc surfaces. However, the convex arc surfaces can be formed by any other manner such as grinding a board, which is not limited. In addition, the sliding panel 6 is able to assemble with the display module (not shown) through other elements (not shown) so as to hold the display module.

The elastic member 7 is a constant force spring and connects to the main board 1 and the sliding panel 6. The first sliding block 62 rubs against the first spacer layer 2 and the second sliding block 63 rubs against the second spacer layer 4 when an external force is applied to the sliding panel 6 so that the sliding panel 6 is able to move along the first axis X between the highest position and the lowest position with respect to the main board 1. The elastic member 7 continuously provides an elastic force so that the sliding panel 6 holding the display module is able to stop at any position with respect to the main board 1 when the external force is removed.

Since the first spacer layer 2 and the second spacer layer 4 are disposed between the main board 1 and the first board 3 and the second board 5 respectively, the thickness of the supporting device 1000 depends on the sum of the thicknesses of the main board 1, the first spacer layer 2, the second spacer layer 4, the first board 3 and the second board 5. For example, a sum of the thicknesses T of the main board 1, the first spacer layer 2 and the first board 3 is less than 6 millimeters in view of a third axis Z (which is perpendicular to the first axis X and the second axis Y). Even though the supporting device 1000 further comprises a front housing and a back housing (not shown) to enclose the main board 1, the first spacer layer 2, the second spacer layer 4, the first board 3 and the second board 5, the total thickness of the supporting device 100 is still less than 10 millimeters. The supporting device 1000 of the present invention is therefore slim. It is noted that the thickness of the supporting device 1000 is not limited. The total thickness of the supporting device 100 is easily adjustable by choosing the main board 1, the first spacer layer 2, the second spacer layer 4, the first board 3 and the second board 5 with different thicknesses.

In another embodiment of the present invention, the friction between the sliding panel 6 and the sliding grooves S1, S2 is adjusted, resulting from the first sliding block 62 further contacts with the main board 1 or the first board 3, and the second sliding block 63 further contacts with the main board 1 or the second board 5. Alternatively, the first sliding block 62 simultaneously contacts with the main board 1 and the first board 3, and the second sliding block 63 simultaneously contacts with the main board 1 and the second board 5.

In the present embodiment, the first sliding block 62, the second sliding block 63, the main board 1, the first board 3, the second board 5, the first spacer layer 2 and the second spacer layer 4 are made of the material selected from the group consisting of polyaryletherketone, polyethylene and modified polyethylene.

Figure 3:
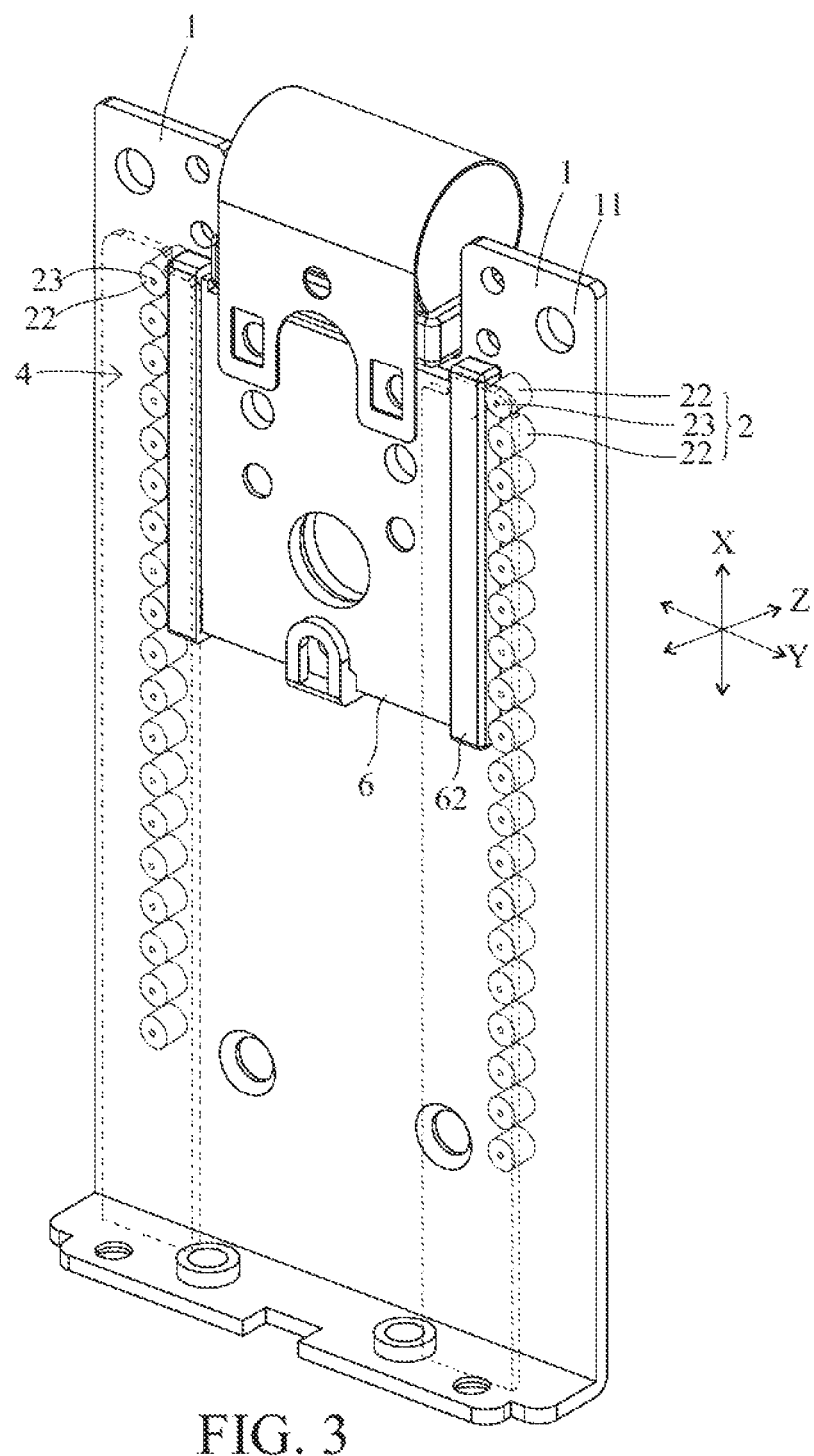
FIG. 3 is a perspective view of the supporting device of the second embodiment of the present invention.

FIG. 3 is a perspective view of the supporting device of the second embodiment of the present invention. The difference between the present embodiment and the first embodiment is that both of the first spacer layer 2 and the second spacer layer 4 of the present embodiment have a plurality of rollers 22 and a plurality of rolling shafts 23. Since the structure of the first spacer 2 is the same with the structure of the second spacer layer 4, the following descriptions only illustrate the detailed structure of the first spacer layer 2. The rollers 22 of the first spacer layer 2 are sequentially arranged on the surface 11 of the main board 1. Each of the rolling shafts 23 is disposed at a central of each of the rollers 22, and an axis defined by the rolling shafts 23 is parallel to the third axis Z and perpendicular to the first axis X. When the sliding panel 6 moves along the first axis X with respect to the main board 1, the first sliding block 62 contacts with an arc surface of each of the rollers 22 so that the rollers 22 rotate about the rolling shafts 23. Thereby, the first sliding block 62 is adapted to move smoothly along the first axis X through the rollers 22 to reduce the friction between the first sliding block 62 and the first spacer layer 2.

Figure 4:
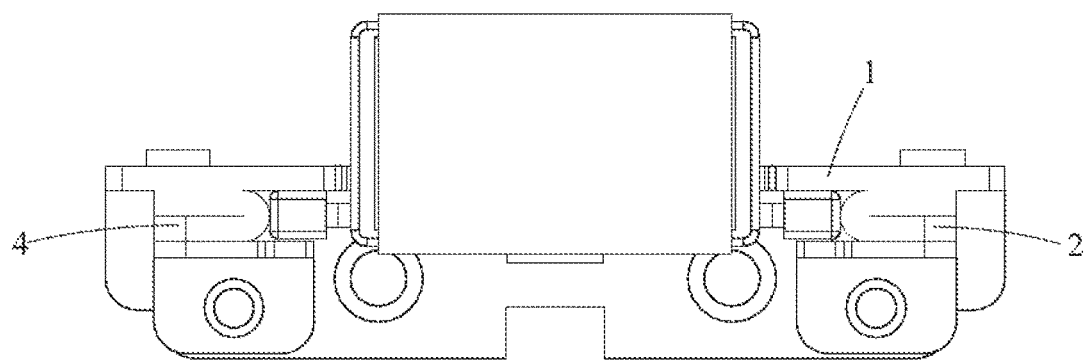
FIG. 4 is a top plane view of the supporting device of the third embodiment of the present invention.
Figure 5:
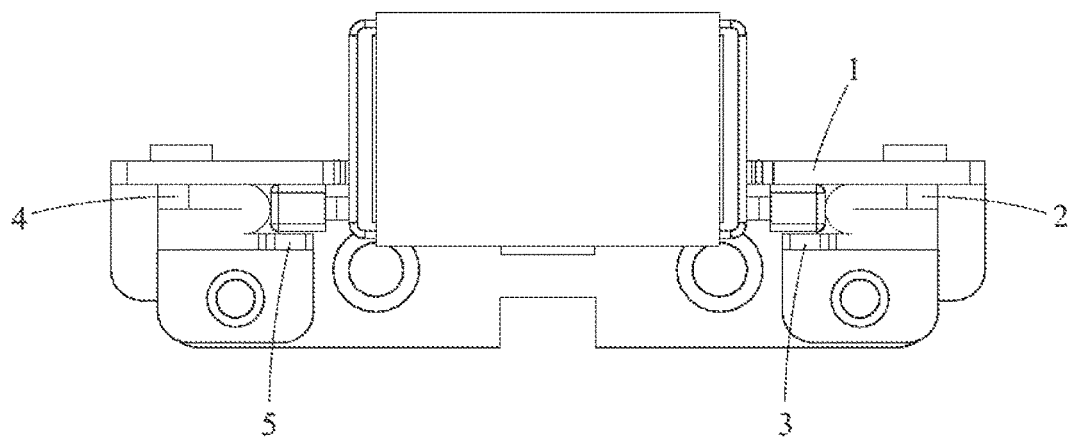
FIG. 5 is a top plane view of the supporting device of the forth embodiment of the present invention.

The third embodiment and the forth embodiment are illustrated in FIG. 4 and FIG. 5 respectively. The structure of the third embodiment is almost the same with the structure of the first embodiment. The difference between the third embodiment and the first embodiment is that the main board 1, the first spacer layer 2 and the second spacer layer 4 are integrally formed in the third embodiment. In the fourth embodiment, the first spacer layer 2 and the first board 3 are integrally formed, and the second spacer layer 4 and the second board 5 are integrally formed. Preferably, the main board 1 is able to be the housing of the supporting device 1000 so that the total thickness of the supporting device is able to be less than 8 millimeters.

In conclusion, unlike the sliding groove of the conventional supporting device being formed by bending a plate, in the present embodiment, the sliding groove is formed by connecting the boards and the spacer layers. Therefore, the total thickness of the supporting device depends on the thicknesses of the boards and the spacer layers. Thereby, the supporting device is able to be slim.

Although the present invention has been explained in relation to its preferred embodiment, it is to be understood that many other possible modifications and variations can be made without departing from the spirit and scope of the invention as hereinafter claimed.

What is claimed is:

1. A supporting device for holding a display module, the supporting device comprising:
 a main board, having a surface;
 a first spacer layer, overlapping on the surface of the main board;
 a first board, being mounted on the first spacer layer, wherein the first board, the main board and the first spacer layer integrally faint a first sliding groove extending along a first axis;
 a sliding panel, being partially received in the first sliding groove, in contact with at least one of the main board, the first spacer layer and the first board, and being holding the display module; and
 an elastic member, being connected to the main board and the sliding panel respectively;
 wherein the sliding panel partially rubs against at least one of the main board, the first spacer layer and the first board when an external force is applied to the sliding panel so that the sliding panel is able to move along the first axis between a highest position and a lowest position with respect to the main board, and the elastic member continuously provides an elastic force so that the sliding panel and the display module is able to stop at any position with respect to the main board when the external force is removed.

2. The supporting device as claimed in claim 1, wherein a width of the main board and a width of the first board are both greater than a width of the first spacer layer, in view of a second axis, so that the main board, the first spacer layer and the first board are overlapped to form the first sliding groove.

3. The supporting device as claimed in claim 1, wherein the sliding panel has a flat plate and a first sliding block disposed on an end of the flat plate, and the first spacer layer has a convex arc surface in contact with the first sliding block.

4. The supporting device as claimed in claim 1, wherein the first spacer layer and the main board are integrally formed.

5. The supporting device as claimed in claim 1, wherein the first spacer layer and the first board are integrally formed.

6. The supporting device as claimed in claim 1, wherein the first spacer layer has a plurality of rollers and a plurality of rolling shafts, the rollers are sequentially arranged on the surface of the main board, each of the rolling shafts is disposed at a central of each of the rollers, and an axis defined by the rolling shafts is parallel to a third axis, and wherein when the sliding panel moves along the first axis with respect to the main board, the first sliding block contacts with an arc surface of each of the rollers so that the rollers rotate about the rolling shafts.

7. The supporting device as claimed in claim 3, further comprising a second spacer layer and a second board, wherein the second spacer layer is disposed on the surface of the main board, and the second board is mounted on the second spacer layer so that the main board, the second spacer layer and the second board collaboratively form a second sliding groove, wherein the sliding panel has a second sliding block being connected to the other end of the flat plate, being received in the second sliding groove, and in contacting with at least one of the main board, the second spacer layer and the second board, so that the second sliding block is able to rub against at least one of the main board, the first spacer layer and the first board when the external force is applied to the sliding panel.

8. The supporting device as claimed in claim 7, wherein a width of the main board and a width of the second board are both greater than a width of the second spacer layer in view of a second axis so that the main board, the second spacer layer and the second board are fixed to form the second sliding groove.

9. The supporting device as claimed in claim 7, wherein the first sliding block simultaneously contacts with the main board, the first spacer layer and the first board, and the second sliding block simultaneously contacts with the main board, the second spacer layer and the second board.

* * * * *